United States Patent
Masuyama et al.

(10) Patent No.: US 9,548,549 B1
(45) Date of Patent: Jan. 17, 2017

(54) CABLE CONNECTION STRUCTURE AND CABLE ARRANGING PART

(71) Applicant: JAPAN AVIATION ELECTRONICS INDUSTRY, LIMITED, Tokyo (JP)

(72) Inventors: Shuichi Masuyama, Tokyo (JP); Tatsuya Shioda, Tokyo (JP); Daisuke Hirao, Tokyo (JP); Tetsuya Takebe, Tokyo (JP); Hiroyasu Koizumi, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 15/171,257

(22) Filed: Jun. 2, 2016

(30) Foreign Application Priority Data

Jul. 15, 2015 (JP) .................................. 2015-141528

(51) Int. Cl.
  *H01R 9/05* (2006.01)
  *H01R 12/53* (2011.01)
  *H01B 11/18* (2006.01)
  *H05K 1/18* (2006.01)

(52) U.S. Cl.
  CPC ............. *H01R 12/53* (2013.01); *H01B 11/18* (2013.01); *H05K 1/18* (2013.01); *H05K 2201/10356* (2013.01); *H05K 2201/10522* (2013.01)

(58) Field of Classification Search
  CPC ..... H01R 4/027; H01R 9/0515; H01R 9/0512; H01R 9/0506; H01R 24/28; H01R 24/30; H01R 24/38; Y10T 29/49123–29/49126

USPC ......... 174/71 C, 72 A, 72 C, 72 R, 74 R, 78; 439/578
  See application file for complete search history.

(56) References Cited

U.S. PATENT DOCUMENTS

| | | | | |
|---|---|---|---|---|
| 5,203,717 A | * | 4/1993 | Beck ................. | H01R 13/5812 439/427 |
| 5,347,711 A | * | 9/1994 | Wheatcraft ......... | B23K 1/0016 156/73.5 |
| 6,305,978 B1 | * | 10/2001 | Ko ......................... | H01R 9/053 439/579 |
| 6,524,135 B1 | * | 2/2003 | Feldman ................ | H01R 9/035 439/607.46 |

(Continued)

FOREIGN PATENT DOCUMENTS

| | | |
|---|---|---|
| JP | 2008-166251 | 7/2008 |
| JP | 2011-86460 | 4/2011 |
| JP | 2014-103130 | 6/2014 |

*Primary Examiner* — Hoa C Nguyen
(74) *Attorney, Agent, or Firm* — Greenblum & Bernstein, P.L.C.

(57) ABSTRACT

A cable arranging part of the present invention has a fixed shape and comprises a position determining portion, a plurality of cable through holes, and an opening. In a state in which the position determining portion is secured to a position reference portion, the cable arranging part is in a predetermined position on a substrate. The cable through holes become perpendicular to a line of the electrodes and parallel to the substrate in the predetermined position. The opening is provided somewhere midway through the cable through holes and a ground cable through hole. As for the sizes of the cable through holes in a perpendicular direction to the substrate in the predetermined position, the size of the cable through hole on the side where the electrodes are located relative to the opening is greater than the size of the cable through hole on the side opposite to the electrodes.

19 Claims, 16 Drawing Sheets

(56) References Cited

U.S. PATENT DOCUMENTS

| | | | | |
|---|---|---|---|---|
| 2001/0022234 A1* | 9/2001 | Okumura | ............ | H01R 9/0512 |
| | | | | 174/78 |
| 2004/0259420 A1* | 12/2004 | Wu | ...................... | H01R 9/0515 |
| | | | | 439/607.05 |
| 2008/0085632 A1* | 4/2008 | Benham | ............... | H01R 9/0515 |
| | | | | 439/579 |
| 2009/0101408 A1* | 4/2009 | Koyama | ............. | H01R 9/0506 |
| | | | | 174/72 A |
| 2010/0330838 A1* | 12/2010 | Buff | .................. | H01R 13/6315 |
| | | | | 439/581 |
| 2011/0237122 A1* | 9/2011 | Schwarz | ............. | H01R 13/514 |
| | | | | 439/578 |
| 2011/0306235 A1* | 12/2011 | Tanaka | ................... | H01R 4/027 |
| | | | | 439/578 |
| 2014/0199885 A1* | 7/2014 | Vinther | ................. | H01R 9/032 |
| | | | | 439/578 |
| 2016/0020564 A1* | 1/2016 | Miyakawa | ......... | H01R 13/4223 |
| | | | | 439/660 |

* cited by examiner

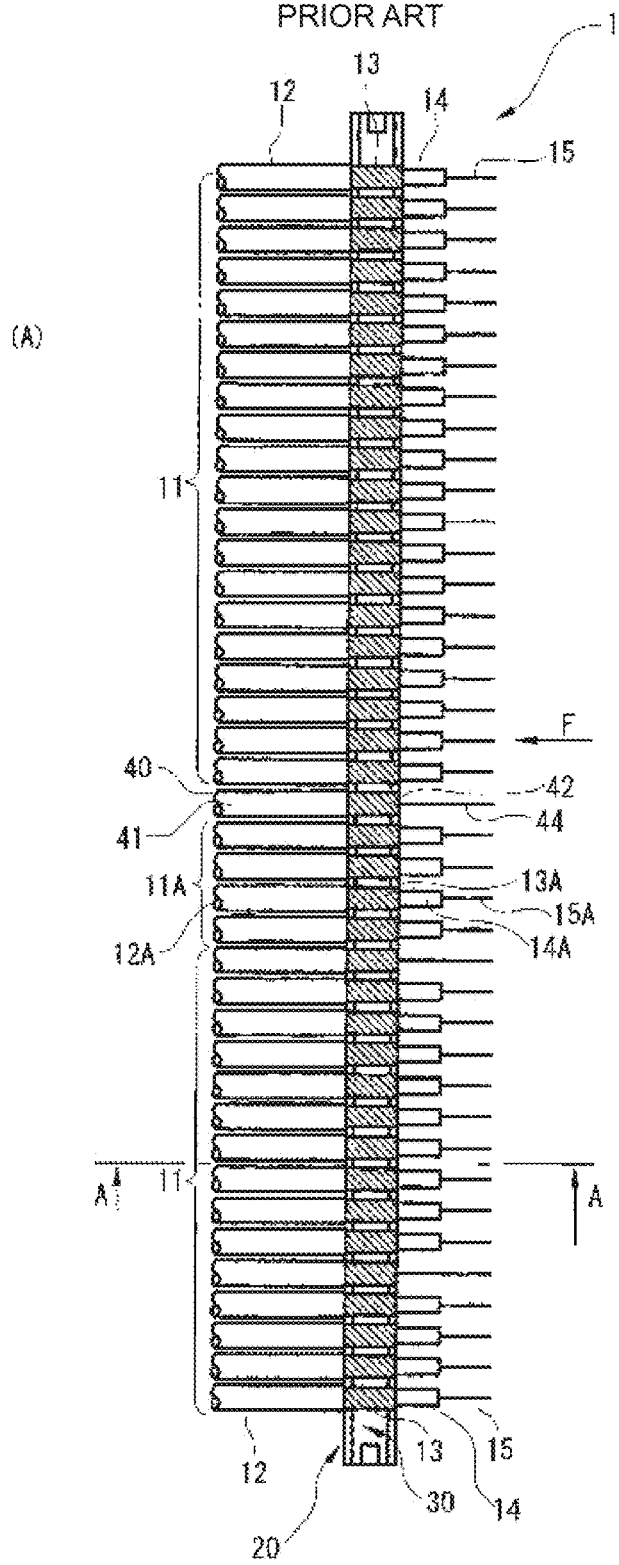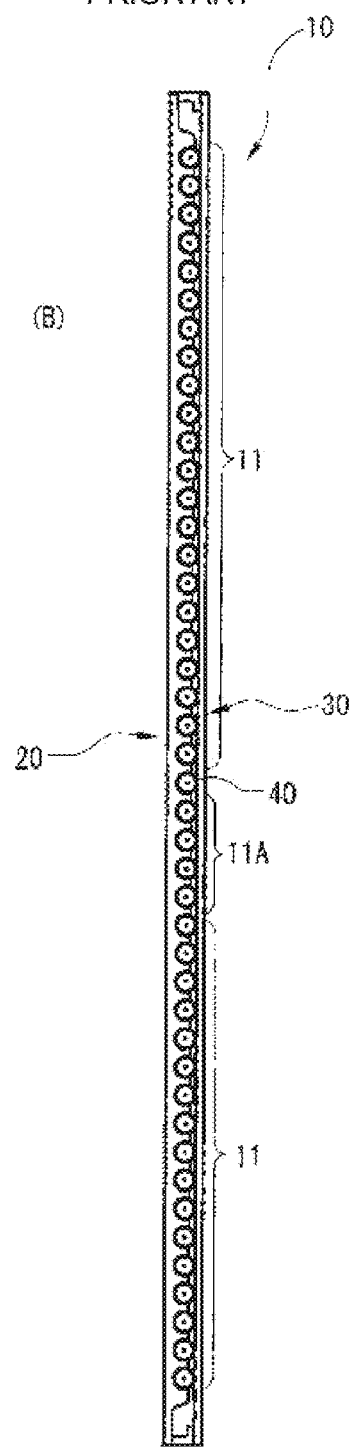
FIG. 3A PRIOR ART
FIG. 3B PRIOR ART

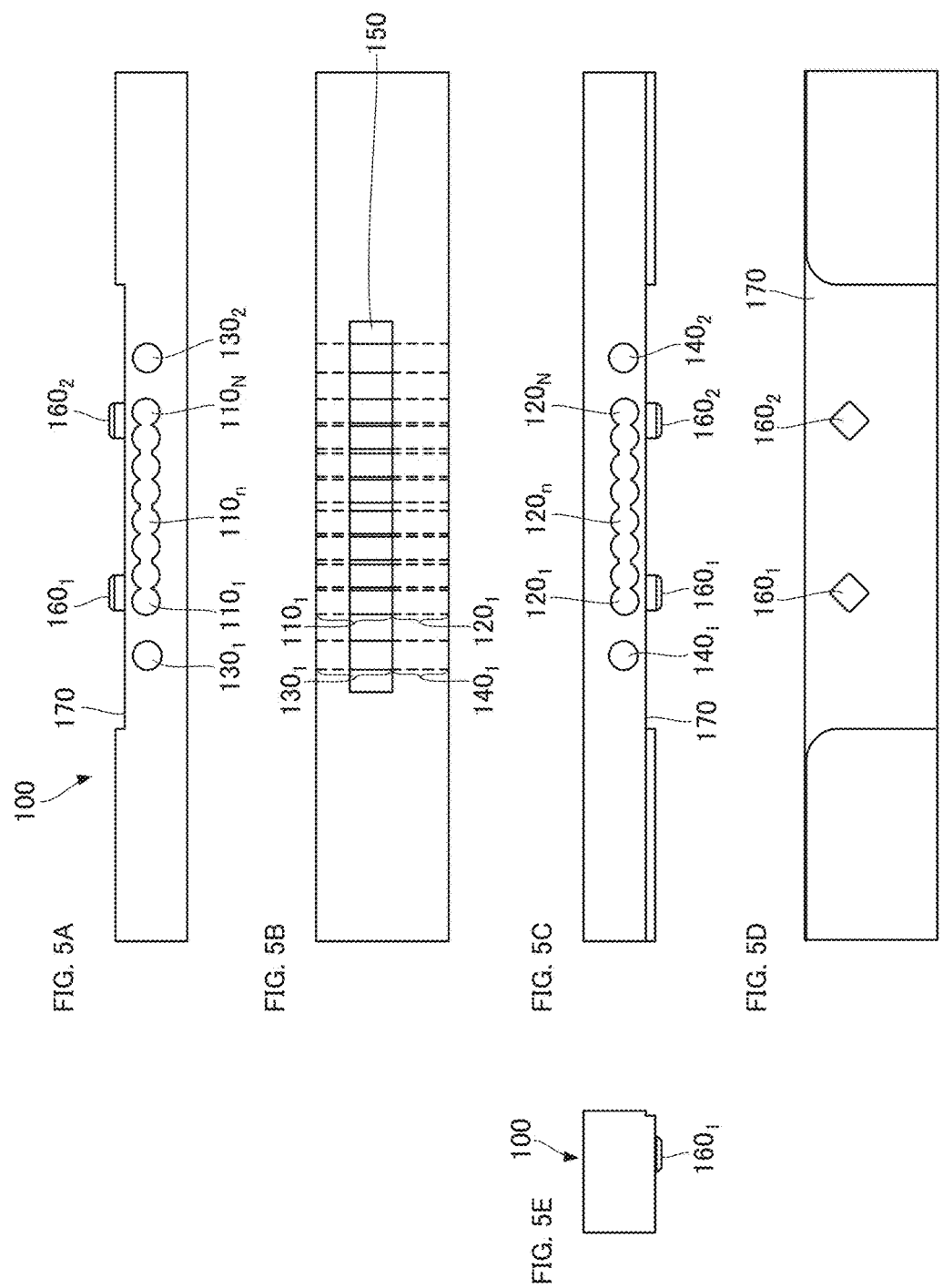

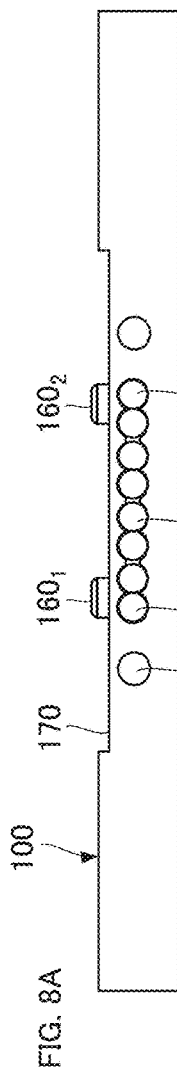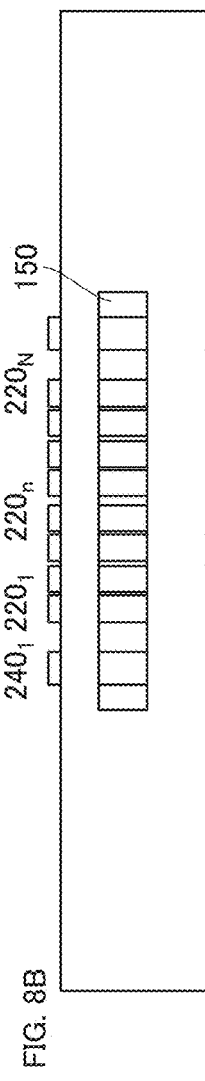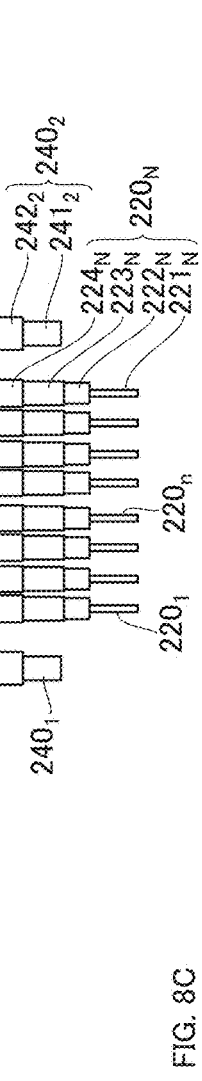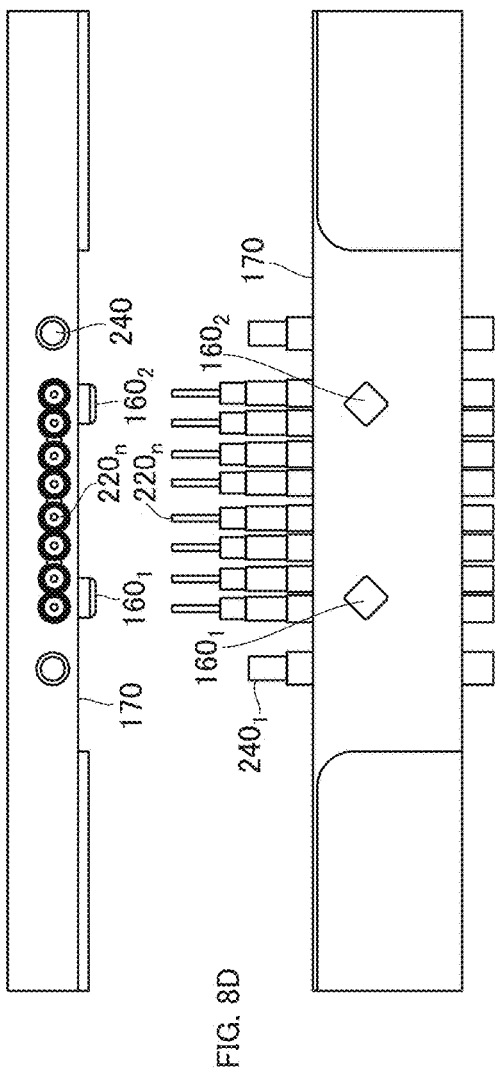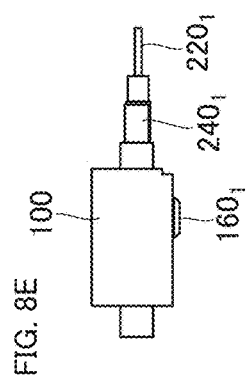

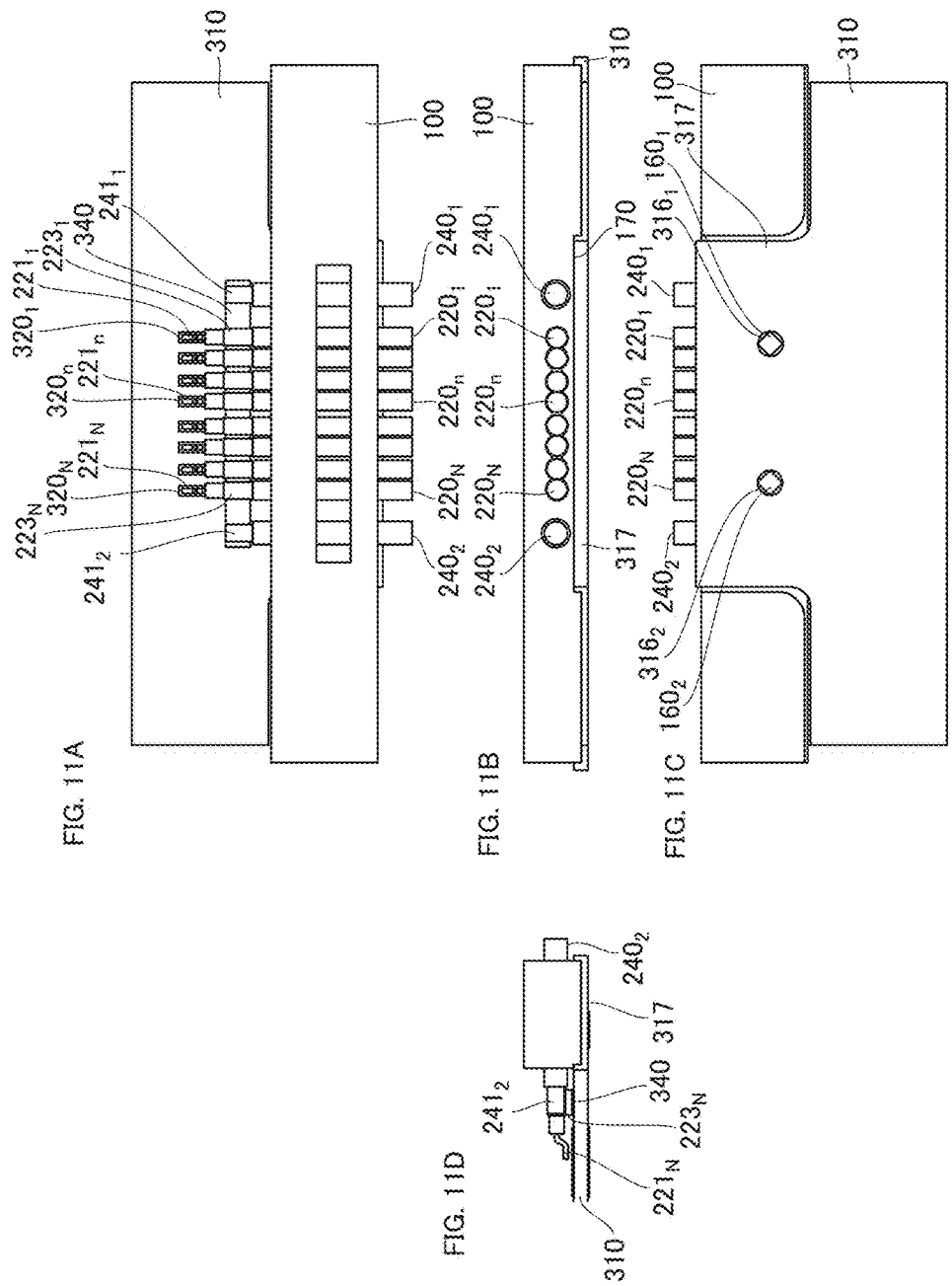

CABLE CONNECTION STRUCTURE AND CABLE ARRANGING PART

TECHNICAL FIELD

The present invention relates to a cable connection structure and a cable arranging part which are used in connecting a plurality of coaxial cables to a substrate.

BACKGROUND ART

As a method of arranging a plurality of coaxial cables, the techniques, for example, described in Japanese Patent Applications Laid Open Nos. 2011-86460 (hereinafter referred to as "Patent Literature 1"), 2014-103130 (hereinafter referred to as "Patent Literature 2"), and 2008-166251 (hereinafter referred to as "Patent Literature 3") are known. In FIG. 1, FIG. 1 of Patent Literature 1 is depicted. The abstract of Patent Literature 1 states that "A terminal processed cable array according to the present invention is a terminal processed cable array including a plurality of cables and a terminal holding member formed of molded thermoset resin which is not thermally hardened, in which the cables are arranged at particular pitch intervals with the terminals thereof being aligned, terminal-side conductors forming the cables are exposed, and the exposed conductors are fixed at the particular pitch intervals by the terminal holding member".

In FIG. 2, FIG. 1 of Patent Literature 2 is depicted. The abstract of Patent Literature 2 states that "A cable connection structure includes a positioning unit 11 for positioning central conductors 3 in a state in which internal insulators 4 of multi-conductor coaxial cables 2 are fixed between signal electrodes 8 and a ground electrode 9 of a substrate 7 having the signal electrodes 8 to which the central conductors 3 of the multi-conductor coaxial cable 2 are connected and the ground electrode 9 to which external conductors 5 of the multi-conductor coaxial cable 2 are connected. The positioning unit 11 is formed of an adhesive nonconducting material which is hardened after placing the positions of the internal insulators 4 fixed to the positioning unit 11 in alignment".

FIG. 1(A) of Patent Literature 3 is depicted in FIG. 3A, and FIG. 1(B) of Patent Literature 3 is depicted in FIG. 3B. The abstract of Patent Literature 3 states that "In a multi-conductor cable harness 10, coaxial cables 11 for signal transmission, cables 11A for power supply, and a ground cable 40 having a central conductor 44, an external conductor 42 placed on the outer periphery of the central conductor 44, and an outer sheath 41 placed on the outer periphery of the external conductor 42 are arranged in parallel, the outside diameter of an outer sheath 12 of each coaxial cable 11 and the outside diameter of an outer sheath 41 of the ground cable 40 are approximately equal to each other, the outside diameter of an external conductor 13 of each coaxial cable 11, the outside diameter of an external conductor 13A of each cable 11A, and the outside diameter of the external conductor 42 of the ground cable 40 are approximately equal to one another, and the external conductors 13 of the coaxial cables 11, the external conductors 13A of the cables 11A, and the external conductor 42 of the ground cable 40 are conductively connected to common ground bars 20 and 30".

SUMMARY OF THE INVENTION

The techniques described in Patent Literatures 1 and 2 are techniques of arranging a plurality of cables covered with coatings in a plane (performing the arrangement of cables) and performing terminal processing collectively thereon. However, since a sheet-like object (a polyimide sheet in Patent Literature 1 and a laminated tape in Patent Literature 2) is used in arranging the cables, the above techniques have the drawbacks of, for example, difficulty in determining a cable arrangement pitch (a space between one cable and another) accurately and difficulty in handling the sheet-like object while maintaining the planar state because of the flexibility of the sheet-like object. The techniques described in Patent Literature 3 are not techniques of arranging a plurality of cables in a plane (performing the arrangement of cables) and performing terminal processing collectively thereon, but a technique of connecting external conductors of coaxial cables individually subjected to terminal processing and a ground cable and a technique of positioning central conductors.

In view of the circumstances described above, an object of the present invention is to provide a cable connection structure and a cable arranging part which facilitate processing from a process of arranging a plurality of cables covered with coatings in a plane to a process of connecting the cables to electrodes on a substrate.

A first cable connection structure of the present invention is a cable connection structure comprising a cable arranging part for connecting a ground cable and N (N is an integer greater than or equal to 2) coaxial cables to electrodes on a substrate in a state in which the ground cable and the N coaxial cables are arranged in a plane parallel to the substrate. The substrate comprises N electrodes, a ground electrode, and a position reference portion. The N electrodes are arranged in a line. The ground electrode is placed in parallel to the line of the electrodes and has a band-like shape. The position reference portion is a portion serving as the reference with respect to which the positional relationship on the substrate is determined.

The cable arranging part has a fixed shape and comprises a position determining portion, N cable through holes, a ground cable through hole, and an opening. In a state in which the position determining portion is secured to the position reference portion, the cable arranging part is in a predetermined position on the substrate. The N cable through holes become perpendicular to the line of the electrodes and parallel to the substrate in the predetermined position and are holes into and through which the coaxial cables are to be inserted and passed. The ground cable through hole becomes perpendicular to the line of the electrodes and parallel to the substrate in the predetermined position and is a hole into and through which the ground cable is to be inserted and passed. The opening is provided somewhere midway through the N cable through holes and the ground cable through hole.

As for the sizes of the cable through holes in a perpendicular direction to the substrate in the predetermined position, the size of the cable through hole on the side where the electrodes are located relative to the opening is greater than the size of the cable through hole on the side opposite to the electrodes. The N coaxial cables are in a state in which the N coaxial cables are fixed with an adhesive injected from the opening in a state in which the N coaxial cables are inserted into the cable through holes from the side opposite to the electrodes in the predetermined position and passed therethrough. The ground cable is in a state in which the ground cable is fixed with the adhesive injected from the opening in a state in which the ground cable is inserted into the ground cable through hole from the side opposite to the ground electrode in the predetermined position and passed therethrough. In a state in which the cable arranging part is placed in the predetermined position, external conductors of the coaxial cables are connected to the ground electrode, each of central conductors of the coaxial cables is connected to any one of the N electrodes, and a conductor wire of the ground cable is connected to the ground electrode.

A second cable connection structure of the present invention is a cable connection structure comprising a cable arranging part for connecting M (M is an integer greater than or equal to 2) signal cables, each being a coated single-core conductor wire, to electrodes on a substrate by arranging the M signal cables in a plane parallel to the substrate. The substrate comprises M electrodes and a position reference portion. The M electrodes are arranged in a line with a space left therebetween, the space previously set for each of the M electrodes. The position reference portion is a portion serving as the reference with respect to which the positional relationship on the substrate is determined.

The cable arranging part has a fixed shape and comprises a position determining portion, M cable through holes, and an opening. In a state in which the position determining portion is secured to the position reference portion, the cable arranging part is in a predetermined position on the substrate. The M cable through holes are holes into and through which the signal cables are to be inserted and passed, and the M cable through holes become perpendicular to the line of the electrodes and parallel to the substrate in the predetermined position. The opening is provided somewhere midway through the M cable through holes.

As for the sizes of the cable through holes in a perpendicular direction to the substrate in the predetermined position, the size of the cable through hole on the side where the electrodes are located relative to the opening is greater than the size of the cable through hole on the side opposite to the electrodes. The M signal cables are in a state in which the M signal cables are fixed with an adhesive injected from the opening in a state in which the M signal cables are inserted into the cable through holes from the side opposite to the electrodes in the predetermined position and passed therethrough. In a state in which the cable arranging part is placed in the predetermined position, each of the conductor wires of the signal cables is connected to any one of the M electrodes.

With the cable connection structure and the cable arranging part of the present invention, since the cable arranging part has a fixed shape, it is possible to perform terminal processing operations such as inserting and passing the coaxial cables or the signal cables into and through the cable arranging part and removing coatings with ease. Moreover, by securing the position determining portion to the position reference portion, it is possible to determine the position of the cable arranging part on the substrate. Furthermore, as for the sizes of the cable through holes in a perpendicular direction to the substrate in the predetermined position, the size of the cable through hole on the side where the electrodes are located relative to the opening is greater than the size of the cable through hole on the side opposite to the electrodes, which makes it easy to perform insertion of the coaxial cables or the signal cables even when the opening is provided. Therefore, processing from a process of arranging a plurality of cables covered with coatings in a plane to a process of connecting the cables to the electrodes on the substrate becomes easier than the existing processing.

BRIEF DESCRIPTION OF THE DRAWINGS

FIG. 3A is FIG. 1(A) of Patent Literature 3.
FIG. 3B is FIG. 1(B) of Patent Literature 3.
FIG. 5A is a rear view for depicting the structure of the cable arranging part of the first embodiment in detail.
FIG. 5B is a plan view for depicting the structure of the cable arranging part of the first embodiment in detail.
FIG. 5C is a front view for depicting the structure of the cable arranging part of the first embodiment in detail.
FIG. 5D is a bottom view for depicting the structure of the cable arranging part of the first embodiment in detail.
FIG. 5E is a left-side view for depicting the structure of the cable arranging part of the first embodiment in detail.
FIG. 8A is a rear view for depicting a state in which coaxial cables and ground cables are attached to the cable arranging part and coatings, external conductors, and internal insulating layers are removed.
FIG. 8B is a plan view for depicting the state in which the coaxial cables and the ground cables are attached to the cable arranging part and the coatings, the external conductors, and the internal insulating layers are removed.
FIG. 8C is a front view for depicting the state in which the coaxial cables and the ground cables are attached to the cable arranging part and the coatings, the external conductors, and the internal insulating layers are removed.
FIG. 8D is a bottom view for depicting the state in which the coaxial cables and the ground cables are attached to the cable arranging part and the coatings, the external conductors, and the internal insulating layers are removed.
FIG. 8E is a left-side view for depicting the state in which the coaxial cables and the ground cables are attached to the cable arranging part and the coatings, the external conductors, and the internal insulating layers are removed.
FIG. 11A is a plan view for depicting the state in which the cable arranging part in the state depicted in FIG. 9 is attached to the substrate.
FIG. 11B is a rear view for depicting the state in which the cable arranging part in the state depicted in FIG. 9 is attached to the substrate.
FIG. 11C is a bottom view for depicting the state in which the cable arranging part in the state depicted in FIG. 9 is attached to the substrate.
FIG. 11D is a right-side view for depicting the state in which the cable arranging part in the state depicted in FIG. 9 is attached to the substrate.

DETAILED DESCRIPTION OF THE EMBODIMENTS

Hereinafter, embodiments of the present invention will be described in detail. Incidentally, component elements having the same function will be identified with the same numeral and overlapping explanations will be omitted.

First Embodiment

Figure 1:
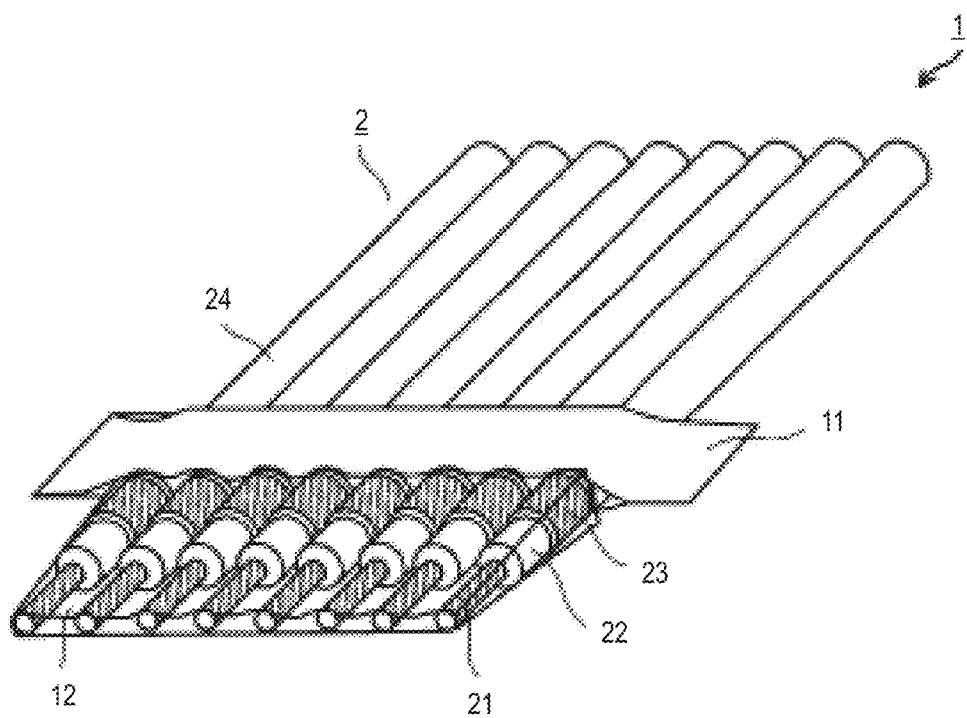
FIG. 1 is FIG. 1 of Patent Literature 1.
Figure 2:
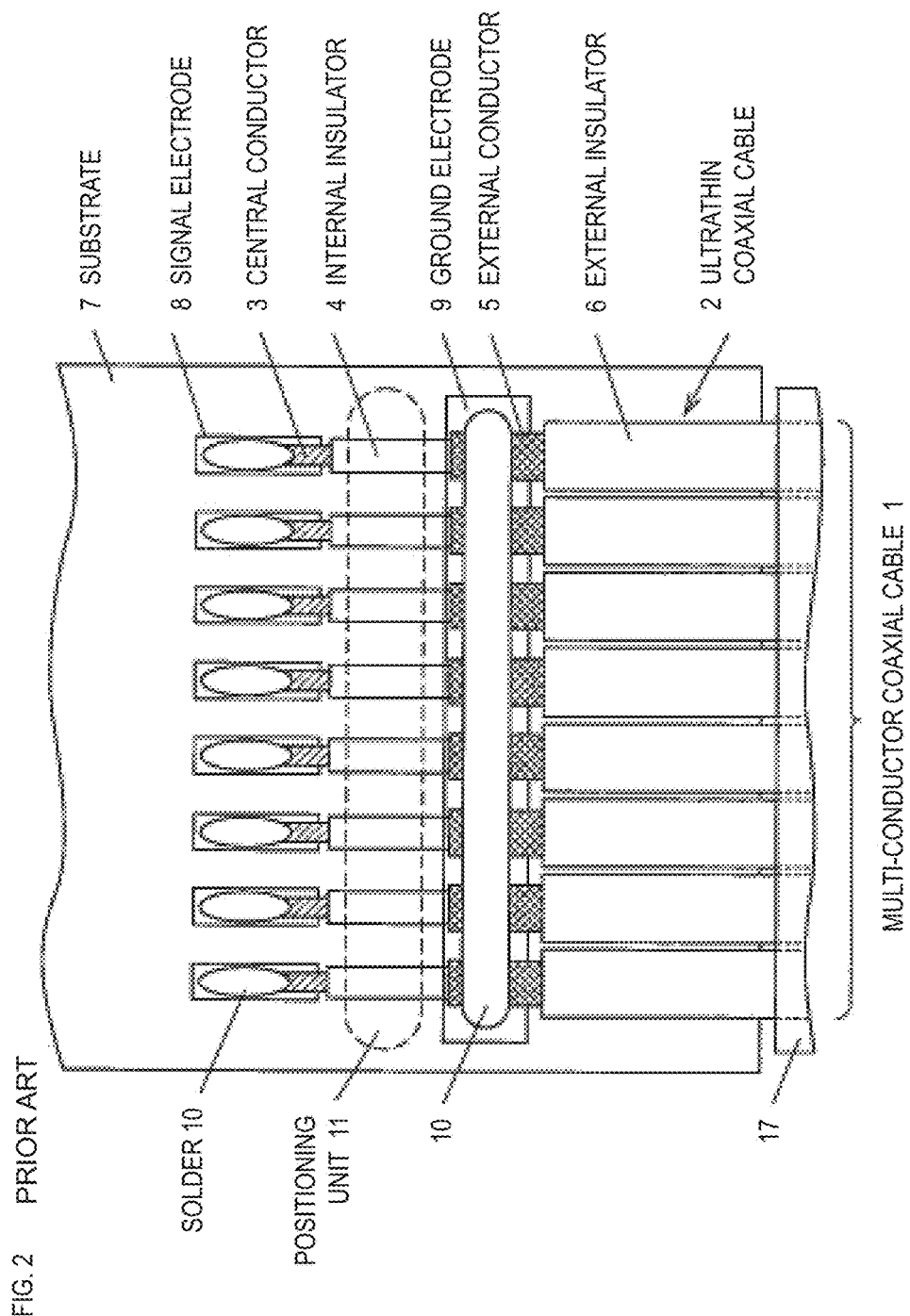
FIG. 2 is FIG. 1 of Patent Literature 2.
Figure 4:
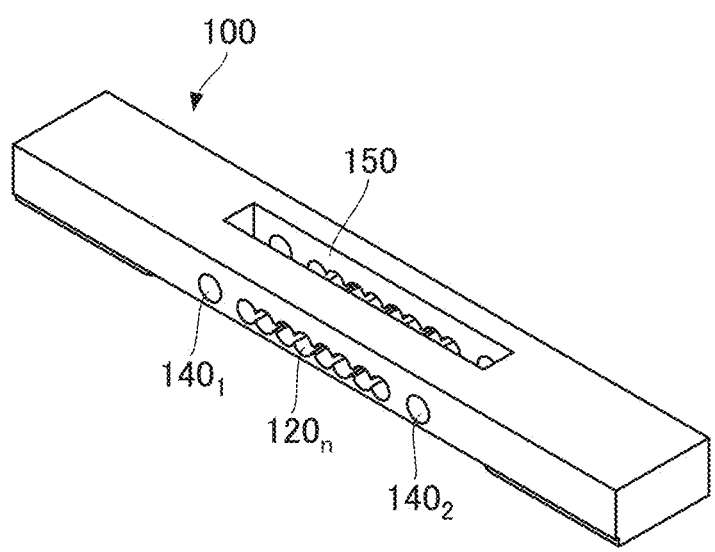
FIG. 4 is a perspective view of a cable arranging part of a first embodiment.
Figure 6A:
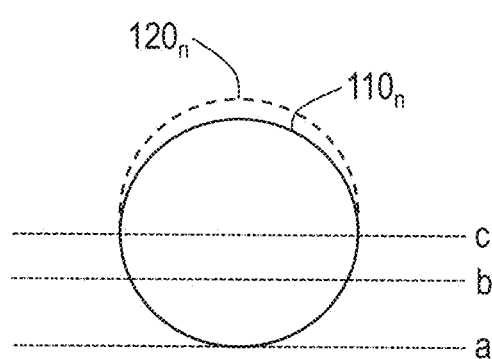
FIG. 6A is a diagram for depicting the shapes of cable through holes of the cable arranging part and a position in which an opening is formed, the diagram depicting a first example of the shapes of the cable through holes.
Figure 6B:
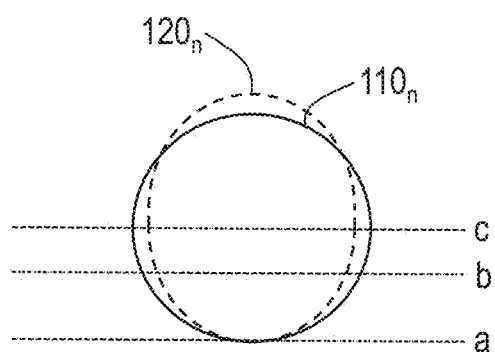
FIG. 6B is a diagram for depicting the shapes of the cable through holes of the cable arranging part and a position in which the opening is formed, the diagram depicting a second example of the shapes of the cable through holes.
Figure 7:
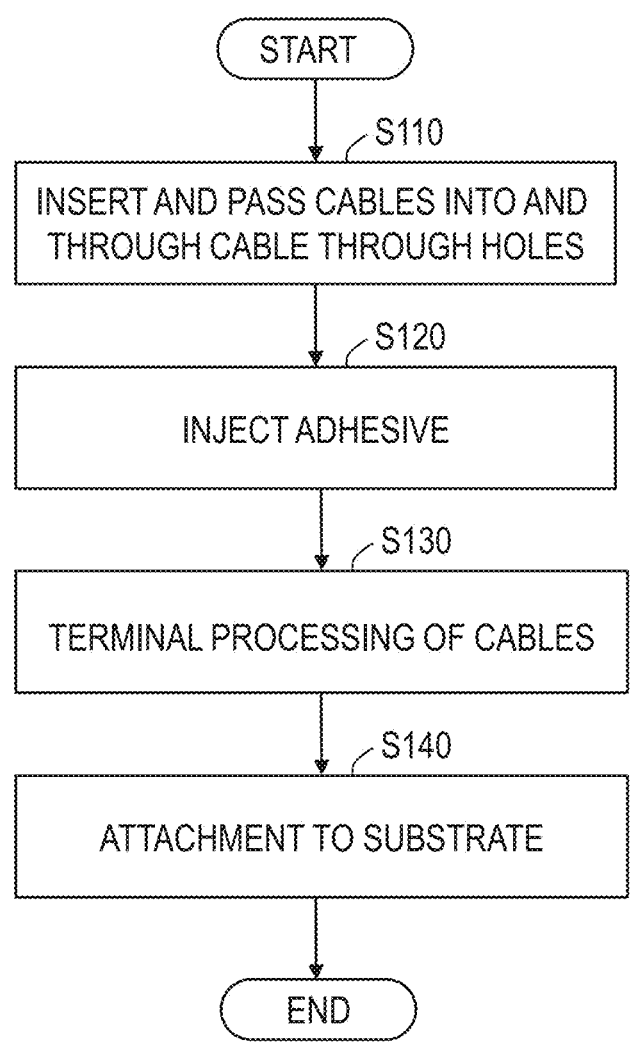
FIG. 7 is a diagram depicting the procedures of a cable connecting method.
Figure 9:
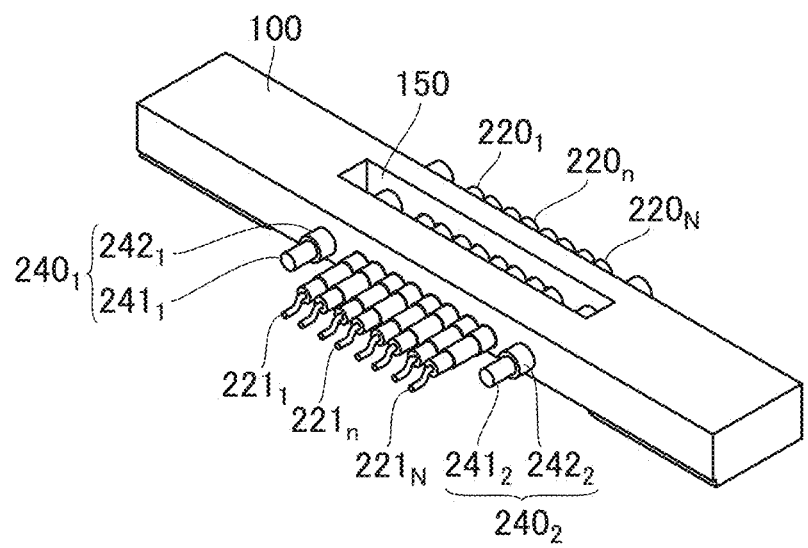
FIG. 9 is a perspective view depicting a state in which the coaxial cables and the ground cables are attached to the cable arranging part and subjected to terminal processing.
Figure 10:
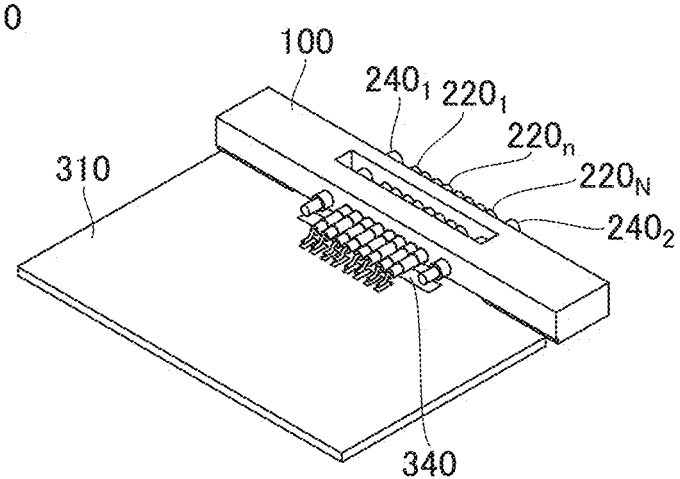
FIG. 10 is a perspective view depicting a state in which the cable arranging part in the state depicted in FIG. 9 is attached to a substrate.
Figure 12A:
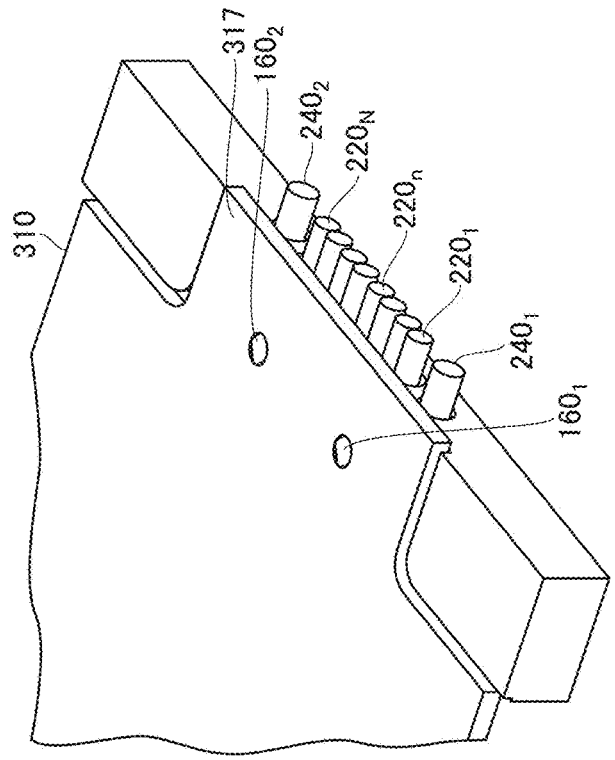
FIG. 12A is a diagram depicting how a position determining portion is secured to a position reference portion when the cable arranging part is attached to the substrate, the diagram depicting a state before the attachment of the cable arranging part to the substrate.
Figure 12B:
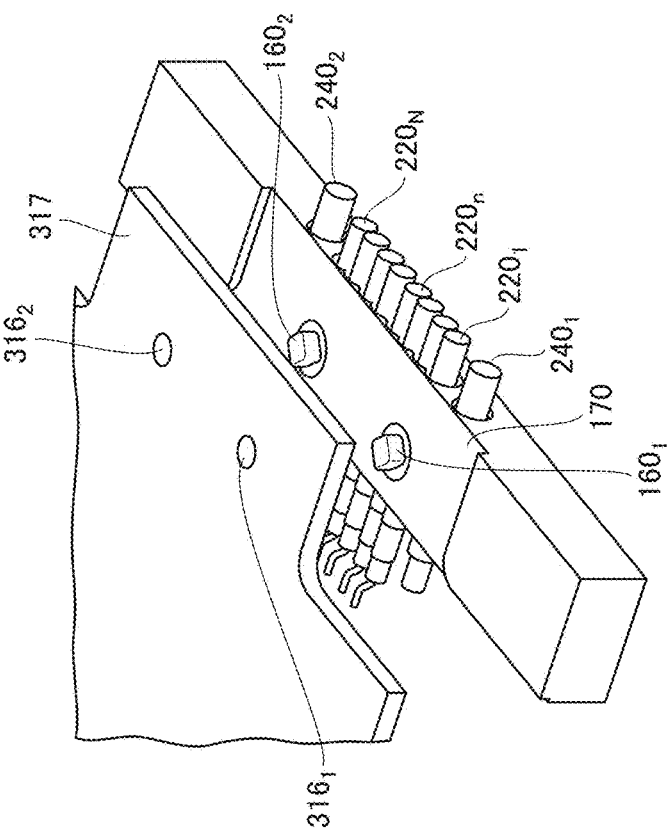
FIG. 12B is a diagram depicting how the position determining portion is secured to the position reference portion when the cable arranging part is attached to the substrate, the diagram depicting a state after the attachment of the cable arranging part to the substrate.

In FIG. 4, a perspective view of a cable arranging part of a first embodiment is depicted. FIGS. 5A to 5E are diagrams depicting the structure of the cable arranging part of the first embodiment in detail. FIGS. 6A and 6B are diagrams for depicting the shapes of cable through holes of the cable arranging part and a position in which an opening is formed. FIG. 6A is a diagram depicting a first example of the shapes of the cable through holes, and FIG. 6B is a diagram depicting a second example of the shapes of the cable through holes. FIG. 7 is a diagram depicting the procedures of a cable connecting method. FIGS. 8A to 8E are diagrams depicting a state in which coaxial cables and ground cables are attached to the cable arranging part and coatings, external conductors, and internal insulating layers are removed. FIG. 9 is a perspective view depicting a state in which the coaxial cables and the ground cables are attached to the cable arranging part and subjected to terminal processing. FIG. 10 is a perspective view depicting a state in which the cable arranging part in the state depicted in FIG. 9 is attached to a substrate, and FIGS. 11A to 11D are diagrams depicting the state in which the cable arranging part in the state depicted in FIG. 9 is attached to the substrate. FIGS. 12A and 12B are diagrams depicting how a position determining portion is secured to a position reference portion when the cable arranging part is attached to the substrate. FIG. 12A is a diagram depicting a state before the attachment of the cable arranging part to the substrate, and FIG. 12B is a diagram depicting a state after the attachment of the cable arranging part to the substrate. In order to explain the orientation of the drawings depicted in FIGS. 5A to 5E, FIGS. 8A to 8E, and FIGS. 11A to 11D, a face of the cable arranging part close to the ends of the coaxial cables and the ground cables (a face close to electrodes when the cable arranging part is attached to the substrate) is regarded as a front face. In this case, FIG. 5A is a rear view, FIG. 5B is a plan view, FIG. 5C is a front view, FIG. 5D is a bottom view, and FIG. 5E is a left-side view. FIG. 8A is a rear view, FIG. 8B is a plan view, FIG. 8C is a front view, FIG. 8D is a bottom view, and FIG. 8E is a left-side view. FIG. 11A is a plan view, FIG. 11B is a rear view, FIG. 11C is a bottom view, and FIG. 11D is a right-side view.

A cable connection structure of the first embodiment is a cable connection structure having a cable arranging part $100$ for connecting ground cables $240_1$ and $240_2$ and N (N is an integer greater than or equal to 2 and n is an integer greater than or equal to 1 but smaller than or equal to N) coaxial cables $220_1, \ldots, 220_N$ to electrodes $320_1, \ldots, 320_N$ and $340$ on a substrate $310$ in a state in which the ground cables $240_1$ and $240_2$ and the N coaxial cables $220_1, \ldots, 220_N$ are arranged in a plane parallel to the substrate $310$. The substrate $310$ comprises the N electrodes $320_1, \ldots, 320_N$, the ground electrode $340$, and position reference portions $316_1$ and $316_2$. The N electrodes $320_1, \ldots, 320_N$ are arranged in a line with spaces left therebetween, each of the spaces previously set. The space left between the electrodes is determined by the characteristics of circuits to be formed on the substrate with consideration given to the type of a signal, for example, and the electrodes do not have to be spaced uniformly. The ground electrode $340$ is placed in parallel to the line of the electrodes $320_1, \ldots, 320_N$ and has a band-like shape. The position reference portions $316_1$ and $316_2$ are portions serving as the reference with respect to which the positional relationship on the substrate $310$ is determined. In the example depicted in FIGS. 11A to 11D and FIGS. 12A and 12B, the position reference portions $316_1$ and $316_2$ are holes provided in the substrate $310$.

The cable arranging part $100$ has a fixed shape and comprises position determining portions $160_1$ and $160_2$, N cable through holes $(110_1, 120_1), \ldots, (110_N, 120_N)$, ground cable through holes $(130_1, 140_1)$ and $(130_2, 140_2)$, and an opening $150$. Having "the fixed shape" means that the cable arranging part $100$ maintains a fixed shape in a series of processes of attaching the coaxial cables $220_1, \ldots, 220_N$ and the ground cables $240_1$ and $240_2$ without being deformed by gravity when the orientation of the cable arranging part $100$ is changed. In a state in which the position determining portions $160_1$ and $160_2$ are secured to the position reference portions $316_1$ and $316_2$, the cable arranging part $100$ is in a predetermined position on the substrate 310. In the example depicted in FIGS. 5A to 5E, FIGS. 8A to 8E, FIGS. 11A to 11D, and FIGS. 12A and 12B, the position determining portions $160_1$ and $160_2$ are protrusions which are inserted into the position reference portions $316_1$ and $316_2$ and the height of the protrusions is lower than the thickness of the substrate 310. As depicted in FIGS. 12A and 12B, as a result of the position determining portions $160_1$ and $160_2$ being inserted into the position reference portions $316_1$ and $316_2$, the cable arranging part 100 is in the predetermined position on the substrate 310.

The N cable through holes $(110_1, 120_1), \ldots, (110_N, 120_N)$ are holes into and through which the coaxial cables $220_1, \ldots, 220_N$ are to be inserted and passed, and the N cable through holes $(110_1, 120_1), \ldots, (110_N, 120_N)$ become perpendicular to the line of the electrodes $320_1, \ldots, 320_N$ and parallel to the substrate 310 in the predetermined position. "In the predetermined position" means being in a state in which the position determining portions $160_1$ and $160_2$ are secured to the position reference portions $316_1$ and $316_2$. The N cable through holes $(110_1, 120_1), \ldots, (110_N, 120_N)$ are formed with spaces left therebetween, the spaces previously set for each of the spaces, in such a way as to correspond to the N electrodes $320_1, \ldots, 320_N$. The cable through holes $(110_n, 120_n)$ each have a diameter which is slightly greater than the diameter of the coaxial cable $220_n$ such that the coaxial cable $220_n$ can be inserted into and passed through the cable through holes $(110_n, 120_n)$, and, as depicted in FIGS. 4, 5A, and 5C, for example, the cable through holes $(110_n, 120_n)$ may be joined to the adjacent cable through holes $(110_{n-1}, 120_{n-1})$ and $(110_{n+1}, 120_{n+1})$.

The ground cable through holes $(130_1, 140_1)$ and $(130_2, 140_2)$ become perpendicular to the line of the electrodes $320_1, \ldots, 320_N$ and parallel to the substrate 310 in the predetermined position and are holes into and through which the ground cables $240_1$ and $240_2$ are to be inserted and passed. The opening 150 is provided somewhere midway through the N cable through holes $(110_1, 120_1), (110_N, 120_N)$ and the ground cable through holes $(130_1, 140_1)$ and $(130_2, 140_2)$.

As for the sizes of the cable through holes $(110_1, 120_1), \ldots, (110_N, 120_N)$ in a perpendicular direction to the substrate 310 in the predetermined position, the size of the cable through hole on the side where the electrodes $320_1, \ldots, 320_N$ are located relative to the opening 150 is greater than the size of the cable through hole on the side opposite to the electrodes $320_1, \ldots, 320_N$. In FIGS. 4 and 5A to 5E, in the predetermined position, the cable through hole $120_n$ is on the side where the electrode $320_n$ is located relative to the opening 150 and the cable through hole $110_n$ is on the side opposite to the electrode $320_n$. FIGS. 6A and 6B are diagrams for depicting the shapes of the cable through holes of the cable arranging part and a position in which the opening is formed. FIGS. 6A and 6B are diagrams of the cable through holes $(110_n, 120_n)$ viewed from the side (the side where the cable through hole $110_n$ is located) opposite to the electrode $320_n$ relative to the opening 150, and a lower side is a side close to the substrate 310. In these drawings, the adjacent cable through holes $(110_{n-1}, 120_{n-1})$ and $(110_{n+1}, 120_{n+1})$ are omitted. FIG. 6A is a diagram depicting a first example of the shapes of the cable through holes $(110_n, 120_n)$. In the predetermined position, the distances between the inner surfaces of the cable through holes $(110_n, 120_n)$, the inner surfaces (the lower side in the drawing) close to the substrate 310, and the substrate 310 are fixed (equal), and, as for the inner surface (an upper side in the drawing) away from the substrate 310, the inner surface of the cable through hole $120_n$ on the side where the electrode $320_n$ is located relative to the opening 150 is farther away from the substrate 310 than the inner surface of the cable through hole $110_n$ on the side opposite to the electrode $320_n$. That is, the cable through hole $120_n$ is longer than the cable through hole $110_n$ in a perpendicular direction (with respect to the substrate 310).

Moreover, FIG. 6B is a diagram depicting a second example of the shapes of the cable through holes $(110_n, 120_n)$. In this example, the size in a horizontal direction with respect to the substrate 310 is changed from the size in FIG. 6A. In the example of FIG. 6B, in the predetermined position, the size of the cable through hole $120_n$ in a parallel direction to the substrate $310_n$, the cable through hole $120_n$ on the side where the electrode $320_n$ is located relative to the opening 150, is smaller than the size of the cable through hole $110_n$ on the side opposite to the electrode $320_n$. In both of FIGS. 6A and 6B, insertion of the coaxial cable $220_n$ is performed in such a way that the coaxial cable $220_n$ is first inserted into the cable through hole $110_n$ and, since the opening 150 is present somewhere midway through the cable through holes $(110_n, 120_n)$, when the coaxial cable $220_n$ is inserted into the cable through hole $120_n$ after being passed through the opening 150, it is impossible to insert the coaxial cable $220_n$ smoothly by holding the end thereof. This makes it more difficult to perform insertion into the cable through hole $120_n$ than insertion into the cable through hole $110_n$. Furthermore, in an attaching step (S140) which will be described later, a high degree of accuracy of vertical positioning of the substrate 310 is not particularly required because press is performed to solder a central conductor $221_n$ to the electrode $320_n$. On the other hand, horizontal positioning of the substrate 310 is required to be performed with accuracy. Therefore, the shapes depicted in FIGS. 6A and 6B are suitable in order to make it easy to perform insertion into the cable through hole $120_n$ while maintaining the accuracy of horizontal positioning.

The cable arranging part 100 is placed in the position of an arranging part attaching portion 317 of the substrate 310. Thus, it is necessary simply to provide a recessed portion 170 in a part of the cable arranging part 100 in which the cable arranging part 100 makes contact with the arranging part attaching portion 317 and adjust the distance between the cable through holes $(110_1, 120_1), \ldots, (110_N, 120_N)$ and the ground cable through holes $140_1$ and $140_2$ and the substrate 310. This adjustment of the distance makes it possible to adjust clearance between external conductors $223_1, \ldots, 223_N$ of the coaxial cables $220_1, \ldots, 220_N$ and conductor wires $241_1$ and $241_2$ of the ground cables $240_1$ and $240_2$ and the ground electrode 340 in the predetermined position. This clearance simply has to be set to clearance suitable to soldering.

A method of forming the cable connection structure has, as depicted in FIG. 7, a cable inserting and passing step (S110), a bonding step (S120), a terminal processing step (S130), and an attaching step (S140). In the cable inserting and passing step (S110), the coaxial cables $220_1, \ldots, 220_N$ are inserted into and passed through the cable through holes $(110_1, 120_1), \ldots, (110_N, 120_N)$ of the cable arranging part 100 from the side where the cable through holes $110_1, \ldots, 110_N$ are located. Moreover, the ground cables $240_1$ and $240_2$ are inserted into and passed through the ground cable through holes $(130_1, 140_1)$ and $(130_2, 140_2)$ from the side where the ground cable through holes $130_1$ and $130_2$ are located.

In the bonding step (S120), an adhesive is injected from the opening 150 in a state in which the ground cables $240_1$ and $240_2$ and the N coaxial cables $220_1, \ldots, 220_N$ are passed through the ground cable through holes ($130_1$, $140_1$) and ($130_2$, $140_2$) and the cable through holes ($110_1$, $120_1$), $\ldots$, ($110_N$, $120_N$), respectively, whereby the ground cables $240_1$ and $240_2$ and the N coaxial cables $220_1, \ldots, 220_N$ are fixed. Incidentally, since the ground cables $240_1$ and $240_2$ and the N coaxial cables $220_1, \ldots, 220_N$ are held by a housing or the like which houses the substrate 310, fixation by the adhesive only has to have strength which is required during an assembly process. Thus, the area of a plane in which the adhesive makes contact with the ground cables $240_1$ and $240_2$ and the N coaxial cables $220_1, \ldots, 220_N$ only has to be an area with which strength which is required during an assembly process can be maintained. For example, the depth of the opening 150, which is formed from the upper side of FIGS. 6A and 6B, may be a depth to a line a (the inner surfaces of the cable through holes $110_n$ and $120_n$, the inner surfaces close to the substrate 310) of FIGS. 6A and 6B, a depth to a line b (about ⅓ from the inner surface of the cable through hole $110_n$, the inner surface close to the substrate 310), or a depth to a line c (half of the cable through hole $110_n$). In other words, the opening 150 is formed in a direction of the cable through holes $110_n$ and $120_n$ from the side away from the substrate 310 in the predetermined position and is not formed in a position closer to the substrate 310 than the inner surfaces of the cable through holes $110_n$ and $120_n$, the inner surfaces close to the substrate 310. As a result, the effect of preventing a reduction in the strength of the cable arranging part 100 as a result of the side of the cable arranging part 100 closer to the substrate 310 than the cable through holes $110_n$ and $120_n$ becoming too thin is also obtained.

In the terminal processing step (S130), terminal processing of the ground cables $240_1$ and $240_2$ and the coaxial cables $220_1, \ldots, 220_N$ is performed by irradiation with laser, for example. FIGS. 8A to 8E are diagrams depicting a state in which the coaxial cables $220_1, \ldots, 220_N$ and the ground cables $240_1$ and $240_2$ are attached to the cable arranging part 100 and coatings $224_1, \ldots, 224_N$ and $242_1$ and $242_2$ of the coaxial cables $220_1, \ldots, 220_N$ and the ground cables $240_1$ and $240_2$, the external conductors $223_1, \ldots, 223_N$ of the coaxial cables $220_1, \ldots, 220_N$, and internal insulating layers $222_1, \ldots, 222_N$ of the coaxial cables $220_1, \ldots, 220_N$ are removed. In the state depicted in FIGS. 8A to 8E, central conductors $221_1, \ldots, 221_N$ of the coaxial cables $220_1, \ldots, 220_N$ are in a straight state. In the terminal processing step (S130), as depicted in FIG. 9, the central conductors $221_1, \ldots, 221_N$ are curved so as to be closer to the substrate 310 to the same extent as the external conductors $223_1, \ldots, 223_N$. As a result of the central conductors $221_1, \ldots, 221_N$ being curved in this way, the conductor wires $241_1$ and $241_2$ of the ground cables $240_1$ and $240_2$ and the external conductors $223_1, \ldots, 223_N$ and the central conductors $221_1, \ldots, 221_N$ of the coaxial cables $220_1, \ldots, 220_N$ are in a state in which the conductor wires $241_1$ and $241_2$ of the ground cables $240_1$ and $240_2$ and the external conductors $223_1, \ldots, 223_N$ and the central conductors $221_1, \ldots, 221_N$ of the coaxial cables $220_1, \ldots, 220_N$ are in contact with almost the same plane.

In the attaching step (S140), the position determining portions $160_1$ and $160_2$ are secured to the position reference portions $316_1$ and $316_2$. Then, soldering of the conductor wires $241_1$ and $241_2$ of the ground cables $240_1$ and $240_2$ and the external conductors $223_1, \ldots, 223_N$ and the central conductors $221_1, \ldots, 221_N$ of the coaxial cables $220_1, \ldots, 220_N$ is performed. More specifically, the conductor wires $241_1$ and $241_2$ of the ground cables $240_1$ and $240_2$ and the external conductors $223_1, \ldots, 223_N$ of the coaxial cables $220_1, \ldots, 220_N$ are soldered to the ground electrode 340, and the central conductor $221_n$ of the coaxial cable $220_n$ is soldered to the electrode $320_n$. As a result of such processing, in a state in which the cable arranging part 100 is placed in the predetermined position, the external conductors $223_1, \ldots, 223_N$ of the coaxial cables $220_1, \ldots, 220_N$ are connected to the ground electrode 340, each of the central conductors $221_1, \ldots, 221_N$ of the coaxial cables $220_1, \ldots, 220_N$ is connected to any one of the N electrodes $320_1, \ldots, 320_N$, and the conductor wires $241_1$ and $241_2$ of the ground cables $240_1$ and $240_2$ are connected to the ground electrode 340.

With the cable connection structure of the first embodiment, since the cable arranging part 100 has a fixed shape, it is possible to perform terminal processing operations such as inserting and passing the coaxial cables $220_1, \ldots, 220_N$ into and through the cable arranging part 100 and removing the coatings $224_1, \ldots, 224_N$ with ease. Moreover, by securing the position determining portions $160_1$ and $160_2$ to the position reference portions $316_1$ and $316_2$, it is possible to determine the position of the cable arranging part 100 on the substrate 310. Furthermore, as for the sizes of the cable through holes ($110_n$, $120_n$) in a perpendicular direction to the substrate 310 in the predetermined position, the size of the cable through hole $120_n$ on the side where the electrode $320_n$ is located relative to the opening 150 is greater than the size of the cable through hole $110_n$ on the side opposite to the electrode $320_n$, which makes it easy to perform insertion of the coaxial cables $220_1, \ldots, 220_N$ even when the opening 150 is provided. Therefore, processing from a process of arranging the plurality of coaxial cables $220_1, \ldots, 220_N$ covered with the coatings $224_1, \ldots, 224_N$ in a plane to a process of connecting the coaxial cables $220_1, \ldots, 220_N$ to the electrodes $320_1, \ldots, 320_N$ on the substrate 310 becomes easier than the existing processing.

Second Embodiment

Figure 13A:
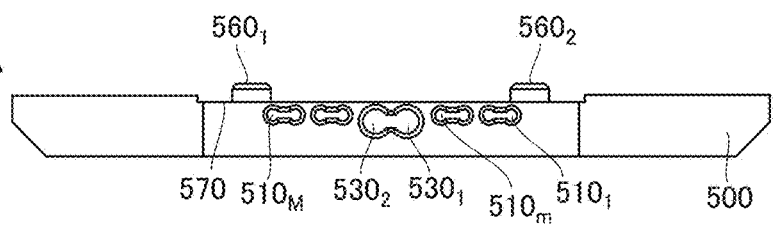
FIG. 13A is a rear view for depicting the structure of a cable arranging part of a second embodiment in detail.
Figure 13B:
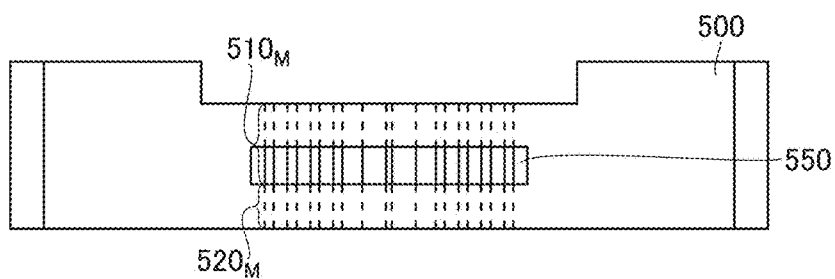
FIG. 13B is a plan view for depicting the structure of the cable arranging part of the second embodiment in detail.
Figure 13C:
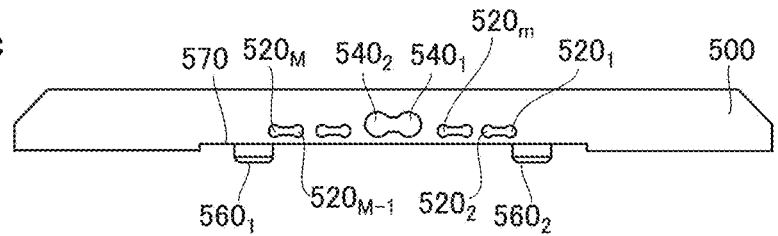
FIG. 13C is a front view for depicting the structure of the cable arranging part of the second embodiment in detail.
Figure 14B:
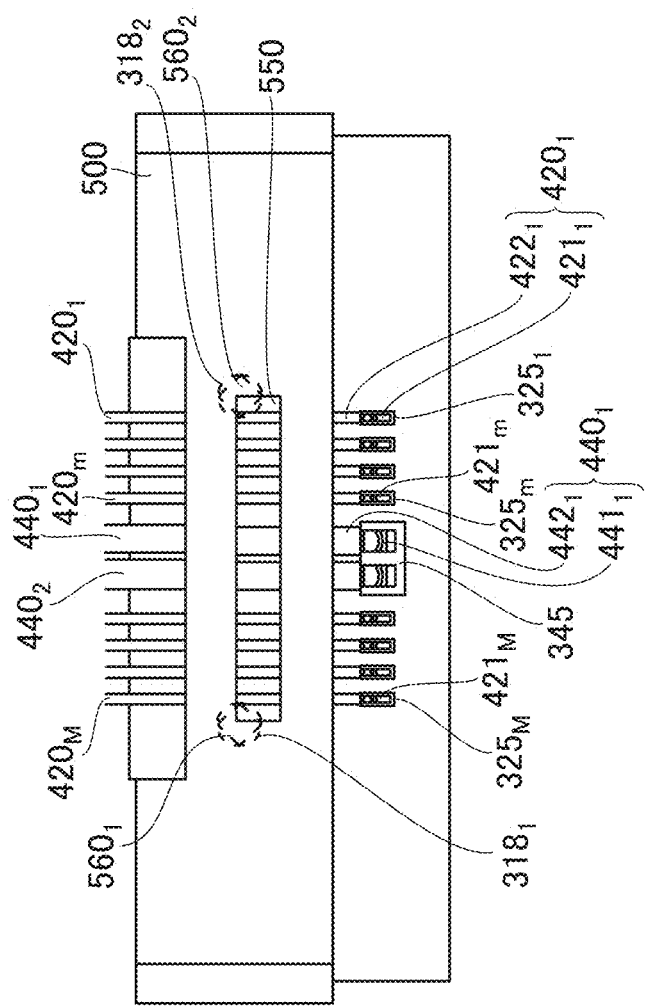
FIG. 14B is a plan view depicting a state in which the signal cables and the power-supply cables (which are coated single-core conductor wires) are fixed with an adhesive in a state in which the signal cables and the power-supply cables are inserted into and passed through the cable arranging part and the signal cables and the power-supply cables are attached to the substrate after being subjected to terminal processing.
Figure 14A:
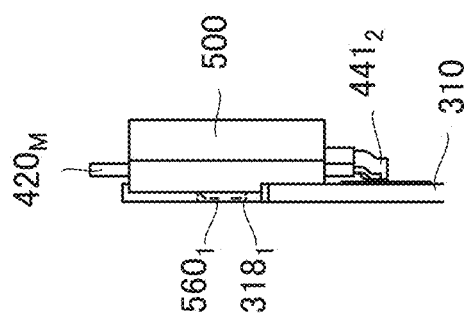
FIG. 14A is a left-side view depicting a state in which signal cables and power-supply cables (which are coated single-core conductor wires) are fixed with an adhesive in a state in which the signal cables and the power-supply cables are inserted into and passed through the cable arranging part and the signal cables and the power-supply cables are attached to the substrate after being subjected to terminal processing.

The first embodiment deals with a coaxial cable. In a second embodiment, a cable connection structure having a cable arranging part for arranging M (M is an integer greater than or equal to 2 and m is an integer greater than or equal to 1 but smaller than or equal to M) signal cables, each being a coated single-core conductor wire, in a plane parallel to a substrate and connecting the signal cables to electrodes on the substrate will be described. FIGS. 13A to 13C are diagrams depicting the structure of the cable arranging part of the second embodiment in detail. FIGS. 14A and 14B are diagrams depicting a state in which the signal cables and power-supply cables (which are coated single-core conductor wires) are fixed with an adhesive in a state in which the signal cables and the power-supply cables are inserted into and passed through the cable arranging part and the signal cables and the power-supply cables are attached to the substrate after being subjected to terminal processing. Incidentally, the power-supply cables may not be provided or any one of the signal cables may be used as a power or grounding cable. In order to explain the orientation of the drawings depicted in FIGS. 13A to 13C and FIGS. 14A and 14B, a face of the cable arranging part close to the ends of the signal cables and the power-supply cables (a face close to the electrodes when the cable arranging part is attached to the substrate) is regarded as a front face. In this case, FIG. 13A is a rear view, FIG. 13B is a plan view, and FIG. 13C is a front view. FIG. 14A is a left-side view and FIG. 14B is a plan view. Incidentally, a signal cable $420_m$ is a conductor wire $421_m$ coated with a coating $422_m$. Power-supply cables $440_1$ are a conductor wire $441_1$ coated with a coating $442_1$. Power-supply cables $440_2$ are also a conductor wire coated with a coating.

A substrate 310 comprises M electrodes $325_1, \ldots, 325_M$, a power-supply electrode 345, and position reference portions $318_1$ and $318_2$. The M electrodes $325_1, \ldots, 325_M$ and the power-supply electrode 345 are arranged in a line with spaces left therebetween, the spaces previously set for each of the spaces. The position reference portions $318_1$ and $318_2$ are portions serving as the reference with respect to which the positional relationship on the substrate 310 is determined.

A cable arranging part 500 has a fixed shape and comprises position determining portions $560_1$ and $560_2$, M cable through holes $(510_1, 520_1), \ldots, (510_m, 520_M)$, power-supply cable through holes $530_1$ and $530_2$, and an opening 550. In a state in which the position determining portions $560_1$ and $560_2$ are secured to the position reference portions $318_1$ and $318_2$, the cable arranging part 500 is in a predetermined position on the substrate 310. Incidentally, as in the case of the first embodiment, it is necessary simply to provide the position reference portions $318_1$ and $318_2$ as holes provided in the substrate 310, provide the position determining portions $560_1$ and $560_2$ as protrusions which are inserted into the position reference portions $318_1$ and $318_2$, and make the height of the protrusions lower than the thickness of the substrate 310.

The M cable through holes $(510_1, 520_1), \ldots, (510_m, 520_M)$ are holes into and through which the signal cables $420_1, \ldots, 420_M$ are to be inserted and passed, and the M cable through holes $(510_1, 520_1), \ldots, (510_M, 520_M)$ become perpendicular to the line of the electrodes $325_1, \ldots, 325_M$ and parallel to the substrate 310 in the predetermined position. The power-supply cable through holes $530_1$ and $530_2$ are holes into and through which the power-supply cables $440_1$ and $440_2$ are to be inserted and passed. The opening 550 is provided somewhere midway through the M cable through holes $(510_1, 520_1), \ldots, (510_M, 520_M)$.

As for the sizes of the cable through holes $(510_m, 520_m)$ in a perpendicular direction to the substrate 310 in the predetermined position, the size of the cable through hole $520_m$ on the side where the electrode $325_m$ is located relative to the opening 550 is greater than the size of the cable through hole $510_m$ on the side opposite to the electrode $325_m$. Incidentally, as described in the first embodiment by using FIGS. 6A and 6B, a configuration only has to be adopted in which, in the predetermined position, the distances between the inner surfaces of the cable through holes $(510_m, 520_m)$, the inner surfaces close to the substrate 310, and the substrate 310 are fixed, and, as for the inner surface away from the substrate 310, the inner surface of the cable through hole $520_m$ on the side where the electrode $325_m$ is located relative to the opening 550 is farther away from the substrate 310 than the inner surface of the cable through hole $510_m$ on the side opposite to the electrode $325_m$. Furthermore, as for the sizes of the cable through holes $(510_m, 520_m)$ in a parallel direction to the substrate 310 in the predetermined position, the size of the cable through hole $520_m$ on the side where the electrode $325_m$ is located relative to the opening 550 may be made smaller than the size of the cable through hole $510_m$ on the side opposite to the electrode $325_m$. The reason why such a shape is suitable is the same as that described in the first embodiment. Moreover, the description given in the first embodiment about the depth of the opening 150 which is adopted in the formation thereof applies to the depth of the opening 550 which is adopted in the formation thereof.

The procedures of the cable connecting method are the same as the procedures of the first embodiment (FIG. 7). Therefore, the M signal cables $420_1, \ldots, 420_M$ are in a state in which the M signal cables $420_1, \ldots, 420_M$ are fixed with an adhesive injected from the opening 550 in a state in which the M signal cables $420_1, \ldots, 420_M$ are inserted into the cable through holes $510_1, \ldots, 510_M$ on the side opposite to the electrodes $325_1, \ldots, 325_M$ and passed therethrough in the predetermined position. In a state in which the cable arranging part 500 is placed in the predetermined position, the conductor wires $421_m$ of the signal cables $420_m$ are connected to the electrode $325_m$.

A recessed portion 570 plays the same role as the recessed portion 170 of the first embodiment. A portion of the cable connection structure of the second embodiment, the portion which has not been described above, is the same as that of the counterpart of the first embodiment. Since the cable connection structure of the second embodiment has the above-described configuration, as in the case of the first embodiment, processing from a process of arranging the plurality of signal cables $420_1, \ldots, 420_M$ covered with the coatings $422_1, \ldots, 422_M$ in a plane to a process of connecting the signal cables $420_1, \ldots, 420_M$ to the electrodes $325_1, \ldots, 325_M$ on the substrate 310 becomes easier than the existing processing.

Third Embodiment

Figure 15A:
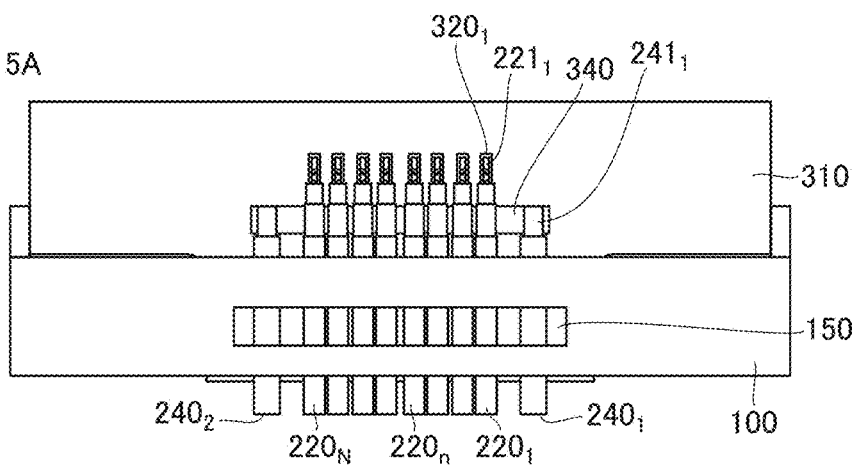
FIG. 15A is a plan view for depicting the structure of a cable arranging part of a third embodiment.
Figure 15B:
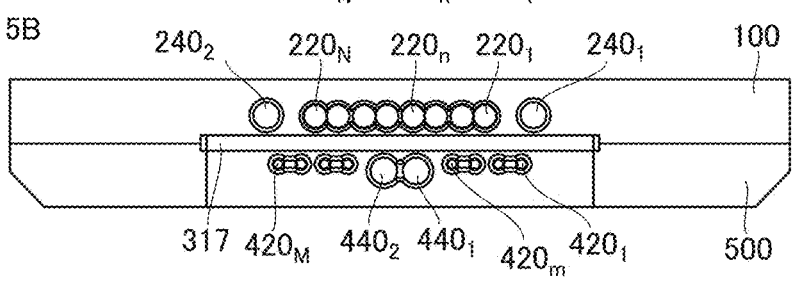
FIG. 15B is a front view for depicting the structure of the cable arranging part of the third embodiment.
Figure 15C:
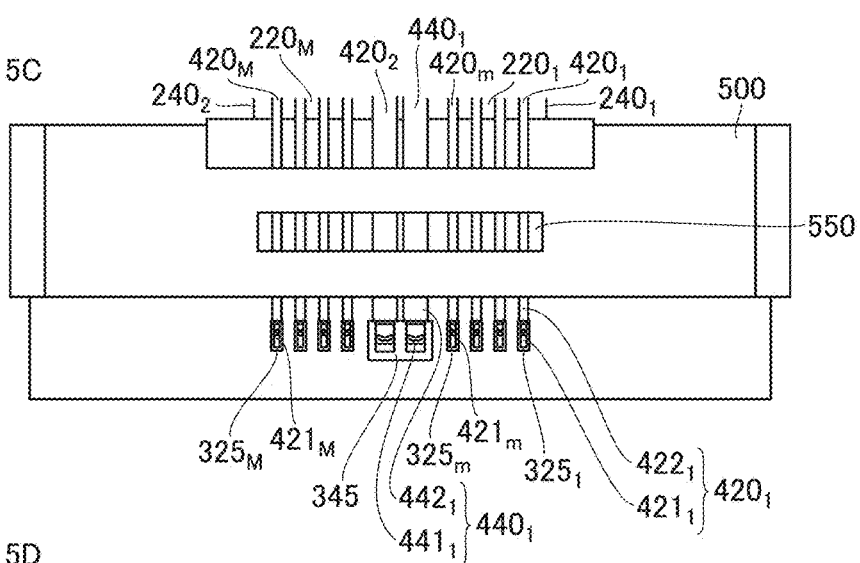
FIG. 15C is a bottom view for depicting the structure of the cable arranging part of the third embodiment.
Figure 15D:
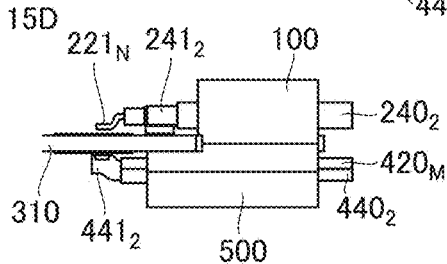
FIG. 15D is a left-side view for depicting the structure of the cable arranging part of the third embodiment.
Figure 16A:
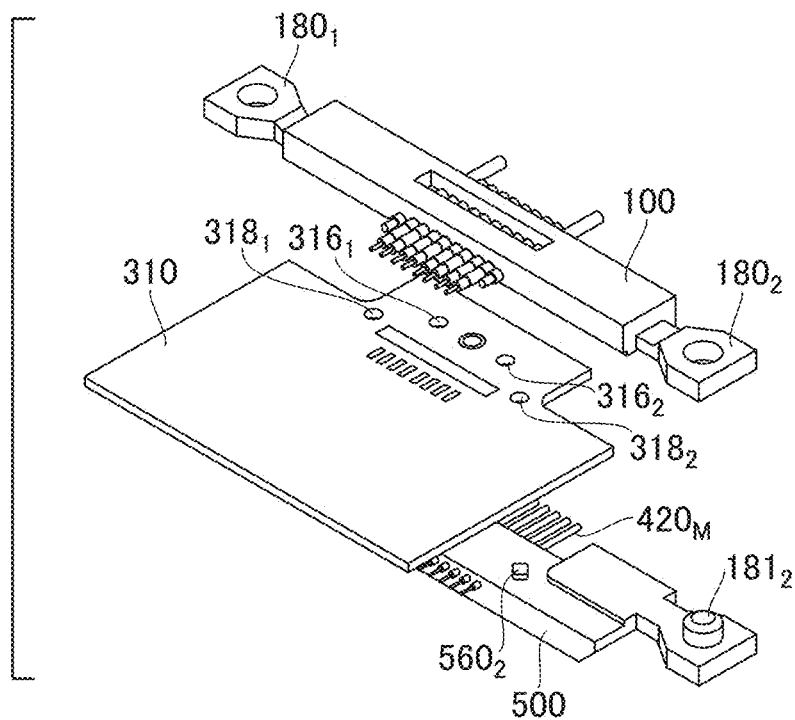
FIG. 16A is a diagram depicting how an attaching step which is performed in forming a cable arranging structure of the third embodiment is performed, the diagram depicting a state before the attachment of the cable arranging parts to the substrate.
Figure 16B:
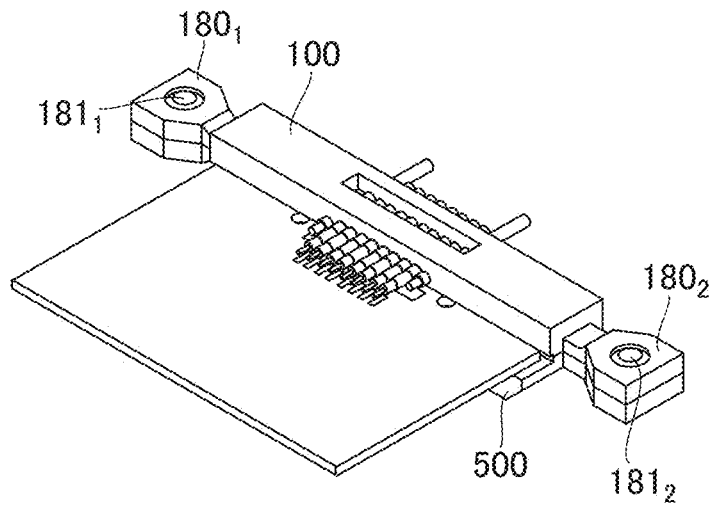
FIG. 16B is a diagram depicting how the attaching step which is performed in forming the cable arranging structure of the third embodiment is performed, the diagram depicting a state after the attachment of the cable arranging parts to the substrate.

A third embodiment is an embodiment obtained by combining the first embodiment and the second embodiment. In FIGS. 15A to 15D, the structure of a cable arranging part of the third embodiment is depicted. FIGS. 16A and 16B are diagrams depicting how an attaching step (S140) which is performed in forming the cable arranging structure of the third embodiment is performed. FIG. 16A is a diagram depicting a state before the cable arranging parts 100 and 500 are attached to the substrate 310, and FIG. 16B is a diagram depicting a state after the cable arranging parts 100 and 500 are attached to the substrate 310. In order to explain the orientation of the drawings depicted in FIGS. 15A to 15D, a face of the cable arranging part close to the ends of the coaxial cables and the ground cables (a face close to the electrodes when the cable arranging part is attached to the substrate) is regarded as a rear face (it is to be noted that a front face and a rear face are opposite in direction to the front face and the rear face in the description of the first and second embodiments). FIG. 15A is a plan view, FIG. 15B is a front view, FIG. 15C is a bottom view, and FIG. 15D is a left-side view.

The third embodiment differs from the first and second embodiments in that fitting holes $180_1$ and $180_2$ are also formed in the cable arranging part 100 and fitting protrusions $181_1$ and $181_2$ are also formed in the cable arranging part 500. The cable arranging parts 100 and 500, the coaxial cables $220_1, \ldots, 220_N$, the ground cables $240_1$ and $240_2$, the signal cables $420_1, \ldots, 420_M$, and the power-supply cables $440_1$ and $440_2$ are the same as those of the first and second embodiments.

In the substrate 310, position reference portions $316_1$ and $316_2$ and position reference portions $318_1$ and $318_2$ are formed, and the cable arranging part 100 and the cable arranging part 500 are placed on different surfaces of the substrate 310. A surface on which electrodes $320_1, \ldots, 320_N$ and 340 are formed is different from a surface on which electrodes $325_1, \ldots, 325_M$ and a power-supply electrode 345 are formed. In the example of FIGS. 16A and 16B, the position reference portions $316_1, 316_2, 318_1$, and $318_2$ are holes formed in the substrate 310. Position determining portions $160_1$, $160_2$, $560_1$, and $560_2$ are protrusions which are inserted into the position reference portions $316_1$, $316_2$, $318_1$, and $318_2$, respectively, and the height of the protrusions is lower than the thickness of the substrate 310. Therefore, the position determining portions $160_1$, $160_2$, $560_1$, and $560_2$ do not become hindrances when the substrate 310 is sandwiched between the cable arranging part 100 and the cable arranging part 500. Moreover, sandwiching the substrate 310 between the cable arranging part 100 and the cable arranging part 500 causes not only the position determining portions $160_1$, $160_2$, $560_1$, and $560_2$ to be inserted into the position reference portions $316_1$, $316_2$, $318_1$, and $318_2$, but also the fitting holes $180_1$ and $180_2$ and the fitting protrusions $181_1$ and $181_2$ to fit together, and fixation is completed. Then, soldering is performed, whereby a cable connection structure of the third embodiment is formed.

A portion of the cable connection structure of the third embodiment, the portion which has not been described above, is the same as that of the counterparts of the first and second embodiments. Since the cable connection structure of the third embodiment has the above-described configuration, as in the case of the first and second embodiments, processing from a process of arranging the plurality of coaxial cables $220_1, \ldots, 220_N$ covered with the coatings $224_1, \ldots, 224_N$ in a plane and a process of arranging the plurality of signal cables $420_1, \ldots, 420_M$ covered with the coatings $422_1, \ldots, 422_M$ in a plane to a process of connecting the coaxial cables $220_1, \ldots, 220_N$ and the signal cables $420_1, \ldots, 420_M$ to the electrodes $320_1, \ldots, 320_N$ and the electrodes $325_1, \ldots, 325_M$, respectively, on the substrate 310 becomes easier than the existing processing.

The foregoing description of the embodiments of the invention has been presented for the purpose of illustration and description. It is not intended to be exhaustive and to limit the invention to the precise form disclosed. Modifications or variations are possible in light of the above teaching. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A cable connection structure comprising:
 a cable arranging part for connecting a ground cable and N coaxial cables to electrodes on a substrate in a state in which the ground cable and the N coaxial cables are arranged in a plane parallel to the substrate, wherein
 N is an integer greater than or equal to 2,
 the substrate comprises
  N electrodes arranged in a line,
  a band-like ground electrode placed in parallel to the line of the electrodes, and
  a position reference portion serving as a reference with respect to which a positional relationship on the substrate is determined,
 the cable arranging part has a fixed shape,
 the cable arranging part comprises
  a position determining portion which causes the cable arranging part to be in a predetermined position on the substrate in a state in which the position determining portion is secured to the position reference portion,
  N cable through holes into which the coaxial cables are to be inserted, the N cable through holes becoming perpendicular to the line of the electrodes and parallel to the substrate in the predetermined position,
  a ground cable through hole into which the ground cable is to be inserted, the ground cable through hole becoming perpendicular to the line of the electrodes and parallel to the substrate in the predetermined position, and
  an opening provided somewhere midway through the N cable through holes and the ground cable through hole,
 as for sizes of the cable through holes in a perpendicular direction to the substrate in the predetermined position, a size of the cable through hole on a side where the electrodes are located relative to the opening is greater than a size of the cable through hole on a side opposite to the electrodes,
 the N coaxial cables are in a state in which the N coaxial cables are fixed with an adhesive injected from the opening in a state in which the N coaxial cables are inserted into the cable through holes from the side opposite to the electrodes in the predetermined position and passed therethrough,
 the ground cable is in a state in which the ground cable is fixed with the adhesive injected from the opening in a state in which the ground cable is inserted into the ground cable through hole from a side opposite to the ground electrode in the predetermined position and passed therethrough, and
 in a state in which the cable arranging part is placed in the predetermined position, external conductors of the coaxial cables are connected to the ground electrode, each of central conductors of the coaxial cables is connected to any one of the N electrodes, and a conductor wire of the ground cable is connected to the ground electrode.

2. The cable connection structure according to claim 1, wherein
 M is an integer greater than or equal to 2,
 the substrate further comprises
  M second electrodes arranged in a line parallel to the line of the N electrodes, on a surface opposite to a surface on which the N electrodes are arranged, and
  a second position reference portion serving as a reference with respect to which a positional relationship on the substrate is determined,
 the cable connection structure further comprises a second cable arranging part for connecting M signal cables, each being a coated single-core conductor wire, to the second electrodes by arranging the M signal cables in a plane parallel to the substrate on a surface opposite to a surface of the substrate to which the coaxial cables are connected,
 the second cable arranging part has a fixed shape,
 the second cable arranging part comprises
  a second position determining portion which causes the second cable arranging part to be in a second predetermined position on the substrate in a state in which the second position determining portion is secured to the second position reference portion,
  M signal cable through holes into which the signal cables are to be inserted, the M signal cable through holes becoming perpendicular to the line of the second electrodes and parallel to the substrate in the second predetermined position, and a second opening provided somewhere midway through the M signal cable through holes, the M signal cables are in a state in which the M signal cables are fixed with an adhesive injected from the second opening in a state in which the M signal cables are inserted into the signal cable through holes from a side opposite to the second electrodes in the second predetermined position and passed therethrough, and in a state in which the second cable arranging part is placed in the second predetermined position, each of the conductor wires of the signal cables is connected to any one of the M second electrodes.

3. The cable connection structure according to claim 1, wherein the position reference portion is a hole provided in the substrate, and the position determining portion is a protrusion which is inserted into the position reference portion and a height of the protrusion is lower than a thickness of the substrate.

4. The cable connection structure according to claim 1, wherein in the predetermined position, distances between inner surfaces of the cable through holes, the inner surfaces close to the substrate, and the substrate are fixed, and, as for the inner surface away from the substrate, the inner surface of the cable through hole on a side where the electrodes are located relative to the opening is farther away from the substrate than the cable through hole on a side opposite to the electrodes.

5. The cable connection structure according to claim 1, wherein as for sizes of the cable through holes in a parallel direction to the substrate in the predetermined position, a size of the cable through hole on a side where the electrodes are located relative to the opening is smaller than a size of the cable through hole on a side opposite to the electrodes.

6. The cable connection structure according to claim 1, wherein the opening is formed in a direction of the cable through holes from a side away from the substrate in the predetermined position and is not formed in a position closer to the substrate than inner surfaces of the cable through holes, the inner surfaces close to the substrate.

7. A cable connection structure comprising:

a cable arranging part for connecting M signal cables, each being a coated single-core conductor wire, to electrodes on a substrate in a state in which the M signal cables are arranged in a plane parallel to the substrate, wherein M is an integer greater than or equal to 2, the substrate comprises M electrodes arranged in a line, and a position reference portion serving as a reference with respect to which a positional relationship on the substrate is determined, the cable arranging part has a fixed shape, the cable arranging part comprises a position determining portion which causes the cable arranging part to be in a predetermined position on the substrate in a state in which the position determining portion is secured to the position reference portion, M cable through holes into which the signal cables are to be inserted, the M cable through holes becoming perpendicular to the line of the electrodes and parallel to the substrate in the predetermined position, and an opening provided somewhere midway through the M cable through holes, as for sizes of the cable through holes in a perpendicular direction to the substrate in the predetermined position, a size of the cable through hole on a side where the electrodes are located relative to the opening is greater than a size of the cable through hole on a side opposite to the electrodes, the M signal cables are in a state in which the M signal cables are fixed with an adhesive injected from the opening in a state in which the M signal cables are inserted into the cable through holes from the side opposite to the electrodes in the predetermined position and passed therethrough, and in a state in which the cable arranging part is placed in the predetermined position, each of the conductor wires of the signal cables is connected to any one of the M electrodes.

8. The cable connection structure according to claim 7, wherein the position reference portion is a hole provided in the substrate, and the position determining portion is a protrusion which is inserted into the position reference portion and a height of the protrusion is lower than a thickness of the substrate.

9. The cable connection structure according to claim 7, wherein in the predetermined position, distances between inner surfaces of the cable through holes, the inner surfaces close to the substrate, and the substrate are fixed, and, as for the inner surface away from the substrate, the inner surface of the cable through hole on a side where the electrodes are located relative to the opening is farther away from the substrate than the cable through hole on a side opposite to the electrodes.

10. The cable connection structure according to claim 7, wherein as for sizes of the cable through holes in a parallel direction to the substrate in the predetermined position, a size of the cable through hole on a side where the electrodes are located relative to the opening is smaller than a size of the cable through hole on a side opposite to the electrodes.

11. The cable connection structure according to claim 7, wherein the opening is formed in a direction of the cable through holes from a side away from the substrate in the predetermined position and is not formed in a position closer to the substrate than inner surfaces of the cable through holes, the inner surfaces close to the substrate.

12. A cable arranging part for connecting a ground cable and N coaxial cables to electrodes on a substrate in a state in which the ground cable and the N coaxial cables are arranged in a plane parallel to the substrate, wherein N is an integer greater than or equal to 2, the substrate comprises N electrodes arranged in a line, a band-like ground electrode placed in parallel to the line of the N electrodes, and a position reference portion serving as a reference with respect to which a positional relationship on the substrate is determined, the cable arranging part has a fixed shape, the cable arranging part comprises
- a position determining portion which causes the cable arranging part to be in a predetermined position on the substrate in a state in which the position determining portion is secured to the position reference portion,
- N cable through holes into which the coaxial cables are to be inserted, the N cable through holes becoming perpendicular to the line of the N electrodes and parallel to the substrate in the predetermined position,
- a ground cable through hole into which the ground cable is to be inserted, the ground cable through hole becoming perpendicular to the line of the N electrodes and parallel to the substrate in the predetermined position, and
- an opening provided somewhere midway through the N cable through holes, and as for sizes of the cable through holes in a perpendicular direction to the substrate in the predetermined position, a size of the cable through hole on a side where the electrodes are located relative to the opening is greater than a size of the cable through hole on a side opposite to the electrodes.

13. The cable arranging part according to claim 12, wherein
in the predetermined position, distances between inner surfaces of the cable through holes, the inner surfaces close to the substrate, and the substrate are fixed, and, as for the inner surface away from the substrate, the inner surface of the cable through hole on a side where the electrodes are located relative to the opening is farther away from the substrate than the cable through hole on a side opposite to the electrodes.

14. The cable arranging part according to claim 12, wherein
as for sizes of the cable through holes in a parallel direction to the substrate in the predetermined position, a size of the cable through hole on a side where the electrodes are located relative to the opening is smaller than a size of the cable through hole on a side opposite to the electrodes.

15. The cable arranging part according to claim 12, wherein
the opening is formed in a direction of the cable through holes from a side away from the substrate in the predetermined position and is not formed in a position closer to the substrate than inner surfaces of the cable through holes, the inner surfaces close to the substrate.

16. A cable arranging part for connecting M signal cables, each being a coated single-core conductor wire, to electrodes on a substrate in a state in which the M signal cables are arranged in a plane parallel to the substrate, wherein M is an integer greater than or equal to 2, the substrate comprises
- M electrodes arranged in a line, and
- a position reference portion serving as a reference with respect to which a positional relationship on the substrate is determined, the cable arranging part has a fixed shape, the cable arranging part comprises
- a position determining portion which causes the cable arranging part to be in a predetermined position on the substrate in a state in which the position determining portion is secured to the position reference portion,
- M cable through holes into which the signal cables are to be inserted, the M cable through holes becoming perpendicular to the line of the electrodes and parallel to the substrate in the predetermined position, and
- an opening provided somewhere midway through the M cable through holes, and as for sizes of the cable through holes in a perpendicular direction to the substrate in the predetermined position, a size of the cable through hole on a side where the electrodes are located relative to the opening is greater than a size of the cable through hole on a side opposite to the electrodes.

17. The cable arranging part according to claim 16, wherein
in the predetermined position, distances between inner surfaces of the cable through holes, the inner surfaces close to the substrate, and the substrate are fixed, and, as for the inner surface away from the substrate, the inner surface of the cable through hole on a side where the electrodes are located relative to the opening is farther away from the substrate than the cable through hole on a side opposite to the electrodes.

18. The cable arranging part according to claim 16, wherein
as for sizes of the cable through holes in a parallel direction to the substrate in the predetermined position, a size of the cable through hole on a side where the electrodes are located relative to the opening is smaller than a size of the cable through hole on a side opposite to the electrodes.

19. The cable arranging part according to claim 16, wherein
the opening is formed in a direction of the cable through holes from a side away from the substrate in the predetermined position and is not formed in a position closer to the substrate than inner surfaces of the cable through holes, the inner surfaces close to the substrate.

* * * * *